(12) United States Patent
Liu et al.

(10) Patent No.: US 12,185,553 B2
(45) Date of Patent: Dec. 31, 2024

(54) SEMICONDUCTOR DEVICE AND METHOD OF FORMING THE SAME

(71) Applicant: Winbond Electronics Corp., Taichung (TW)

(72) Inventors: Chi-Ching Liu, Taichung (TW);
Chih-Chao Huang, Taichung (TW);
Ming-Che Lin, Taichung (TW);
Frederick Chen, San Jose, CA (US);
Han-Huei Hsu, Taichung (TW)

(73) Assignee: Winbond Electronics Corp., Taichung (TW)

( * ) Notice: Subject to any disclaimer, the term of this patent is extended or adjusted under 35 U.S.C. 154(b) by 386 days.

(21) Appl. No.: 17/715,065

(22) Filed: Apr. 7, 2022

(65) Prior Publication Data
US 2023/0329009 A1    Oct. 12, 2023

(51) Int. Cl.
| | |
|---|---|
| H10B 63/00 | (2023.01) |
| H01L 29/06 | (2006.01) |
| H01L 29/66 | (2006.01) |
| H01L 29/78 | (2006.01) |
| H10N 70/00 | (2023.01) |

(52) U.S. Cl.
CPC ......... *H10B 63/34* (2023.02); *H01L 29/0649* (2013.01); *H01L 29/66795* (2013.01); *H01L 29/7851* (2013.01); *H10N 70/011* (2023.02); *H10N 70/8265* (2023.02)

(58) Field of Classification Search
None
See application file for complete search history.

(56) References Cited

U.S. PATENT DOCUMENTS

| | | |
|---|---|---|
| 2007/0004139 A1 | 1/2007 | Kim et al. |
| 2018/0219095 A1 | 8/2018 | Huang et al. |

FOREIGN PATENT DOCUMENTS

| | | |
|---|---|---|
| CN | 1708855 | 12/2005 |

OTHER PUBLICATIONS

"Office Action of Taiwan Counterpart Application", issued on Sep. 29, 2022, p. 1-p. 6.

*Primary Examiner* — Anthony Ho
(74) *Attorney, Agent, or Firm* — JCIPRNET

(57) ABSTRACT

Provided is a semiconductor device including: a substrate, a plurality of isolation structures, a plurality of channel layers, and a gate structure. The substrate includes a plurality of fins thereon. The plurality of isolation structures are respectively disposed between the plurality of fins. A top surface of the plurality of isolation structures is higher than a top surface of the plurality of fins to form a plurality of openings. The plurality of channel layers are respectively disposed in the plurality of openings. Each channel layer is in contact with a corresponding fin and extends to cover a lower sidewall of a corresponding isolation structure, thereby forming a U-shaped structure. The gate structure is filled in the plurality of openings and extends to cover the top surface of the plurality of isolation structures.

8 Claims, 9 Drawing Sheets

SEMICONDUCTOR DEVICE AND METHOD OF FORMING THE SAME

BACKGROUND OF THE INVENTION

Field of the Invention

The present invention relates to an integrated circuit and a method of forming the same, and more particularly to a semiconductor device and a method of forming the same.

Description of Related Art

In recent years, the development of Resistive Random Access Memory (RRAM) has been extremely rapid, and it is the structure of the future memory that attracts the most attention. RRAM is very suitable as a next-generation non-volatile memory device due to its potential advantages of low power consumption, high speed operation, high density and compatibility with Complementary Metal Oxide Semiconductor (CMOS) process technology. The basic structure of the commonly used resistive random access memory is composed of a transistor and a resistor (1T1R). The resistance value of the resistor can be changed by changing the applied bias voltage, thus the device can be in a high resistance state (HRS) or a low high resistance state (LRS), thereby recognizing the 0 or 1 of the digital signal.

With the advancement of technology, all kinds of electronic products are developing towards the trend of high speed, high performance, and light, thin and short size. However, the occupied area of the resistive random access memory is difficult to reduce the unit size due to the large device width of the transistor. Therefore, how to effectively utilize the chip area and achieve miniaturization of devices is a very important topic at present.

SUMMARY OF THE INVENTION

An embodiment of the present invention provides a semiconductor element and a method for forming the same, which can reduce the device width of a transistor to effectively utilize the chip area and achieve the purpose of miniaturizing devices.

An embodiment of the present invention provides a semiconductor device including: a substrate, a plurality of isolation structures, a plurality of channel layers, and a gate structure. The substrate includes a plurality of fins thereon. The plurality of isolation structures are respectively disposed between the plurality of fins. A top surface of the plurality of isolation structures is higher than a top surface of the plurality of fins to form a plurality of openings. The plurality of channel layers are respectively disposed in the plurality of openings. Each channel layer is in contact with a corresponding fin and extends to cover a lower sidewall of a corresponding isolation structure, thereby forming a U-shaped structure. The gate structure is filled in the plurality of openings and extends to cover the top surface of the plurality of isolation structures.

An embodiment of the present invention provides a method for forming a semiconductor element including: providing a substrate comprising a plurality of fins thereon; forming a plurality of isolation structures between the plurality of fins, wherein a top surface of plurality of isolation structures is higher than a top surface of the plurality of fins to form a plurality of openings; forming a plurality of channel material layers to conformally cover a surface of the plurality of openings; performing an oxidation process to oxidize a portion of the plurality of channel material layers into a gate dielectric layer; and forming a gate electrode on the gate dielectric layer to form a gate structure.

Based on above, in the embodiment of the present invention, a plurality of isolation structures are protruded between a plurality of fins, so that a top surface of the plurality of isolation structures is higher than a top surface of the plurality of fins, so as to form a plurality of openings. Next, a plurality of channel layers are respectively formed in the plurality of openings, so that each channel layer is in contact with a corresponding fin and extends to cover a lower sidewall of a corresponding isolation structure, thereby forming a U-shaped structure. The U-shaped structure of the channel layer can effectively increase the device width and reduce the unit size, so as to increase the usable area of the chip, thereby achieving the purpose of miniaturizing devices.

DESCRIPTION OF THE EMBODIMENTS

Figure 1A:
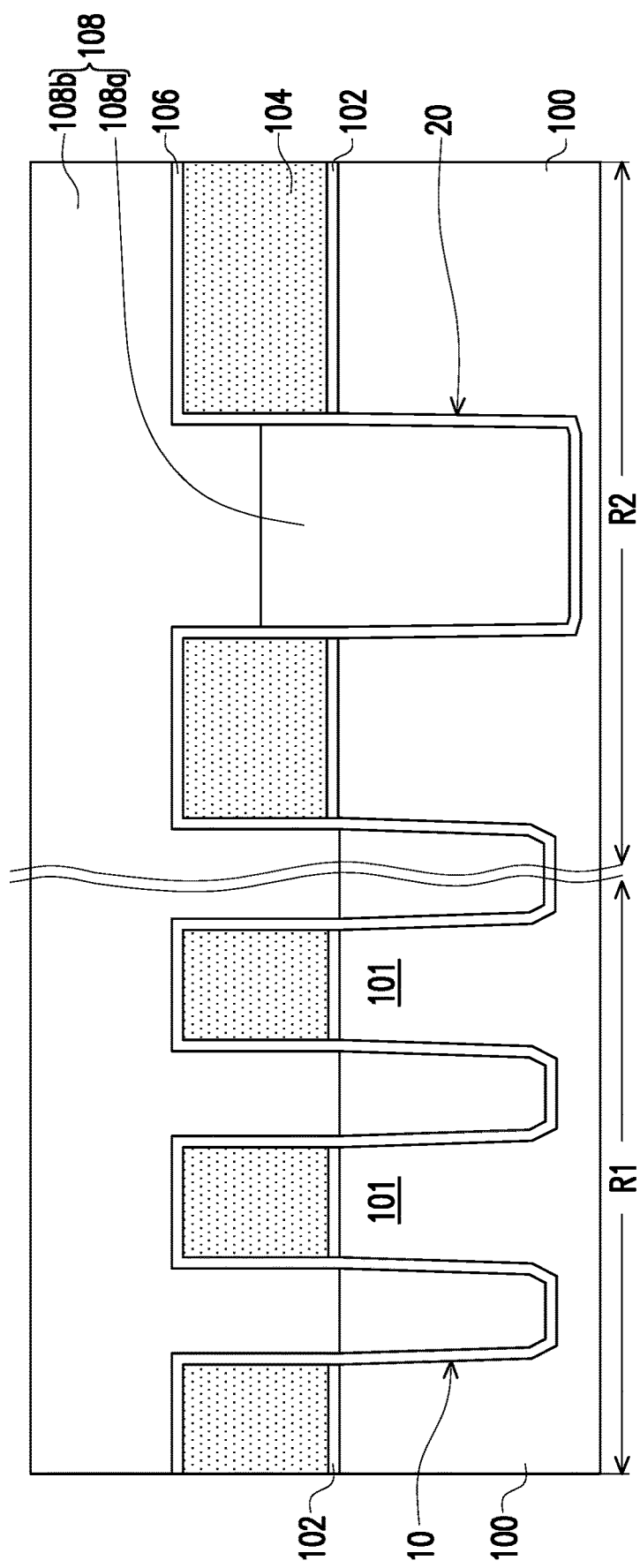
FIG. 1A to FIG. 1H are schematic cross-sectional views of a manufacturing process of a semiconductor device according to a first embodiment of the invention.
Figure 1B:
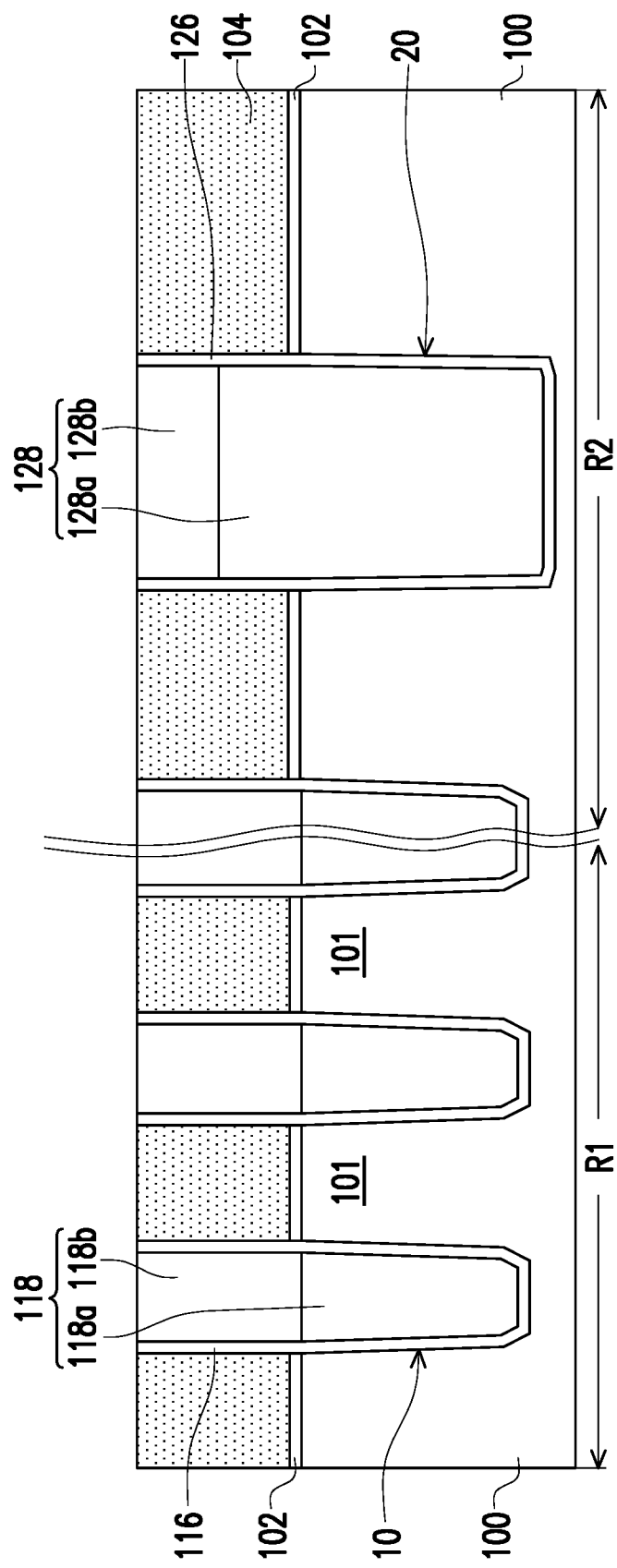
Figure 1C:
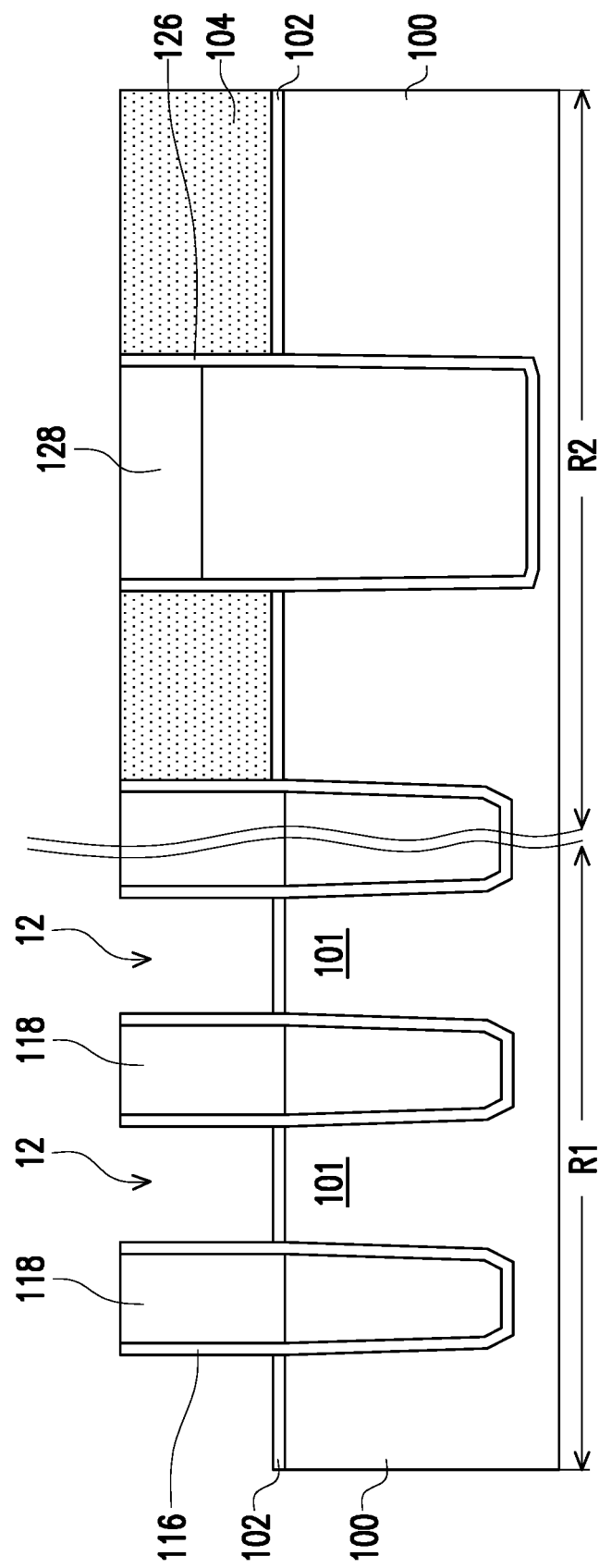
Figure 1D:
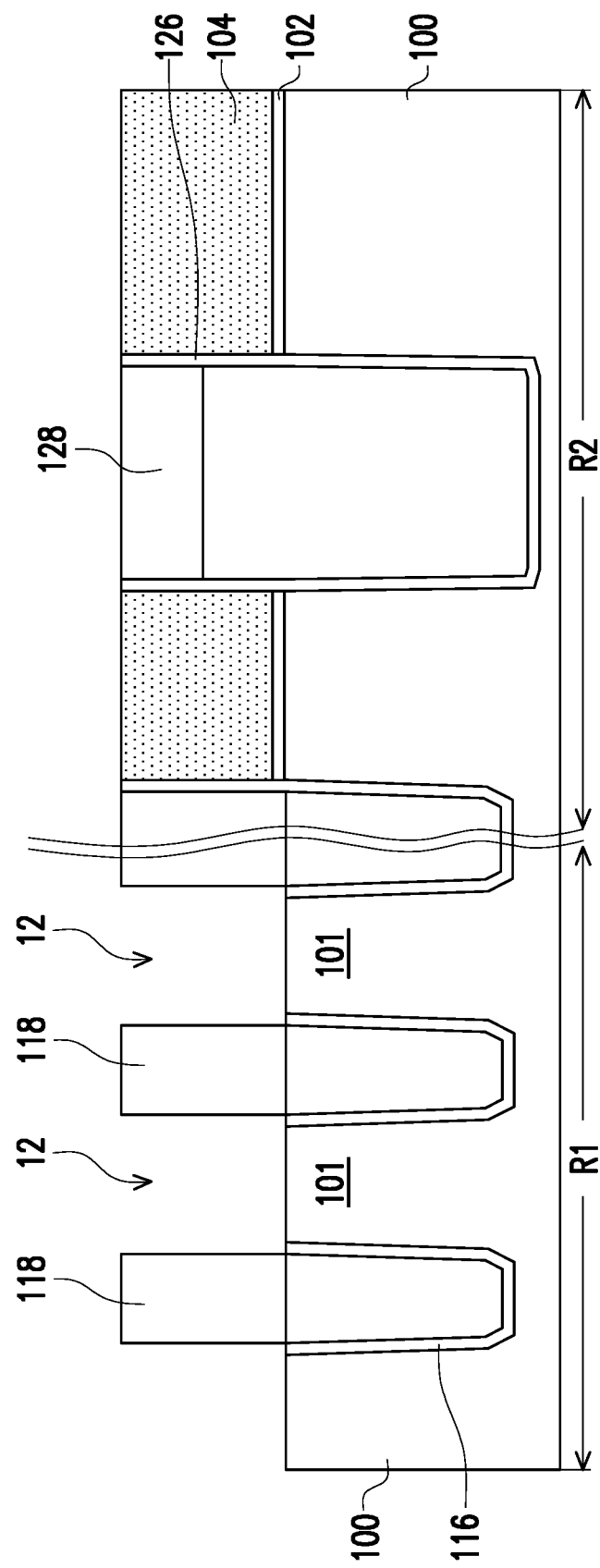
Figure 1E:
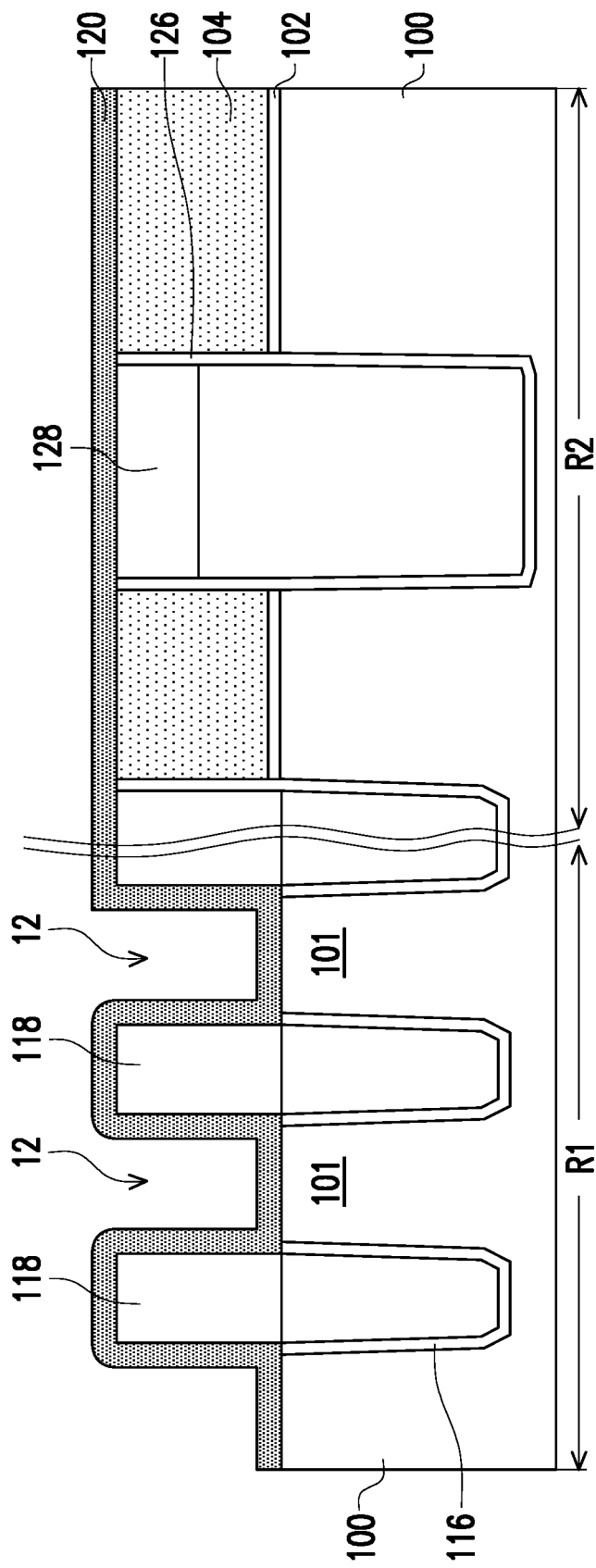
Figure 1F:
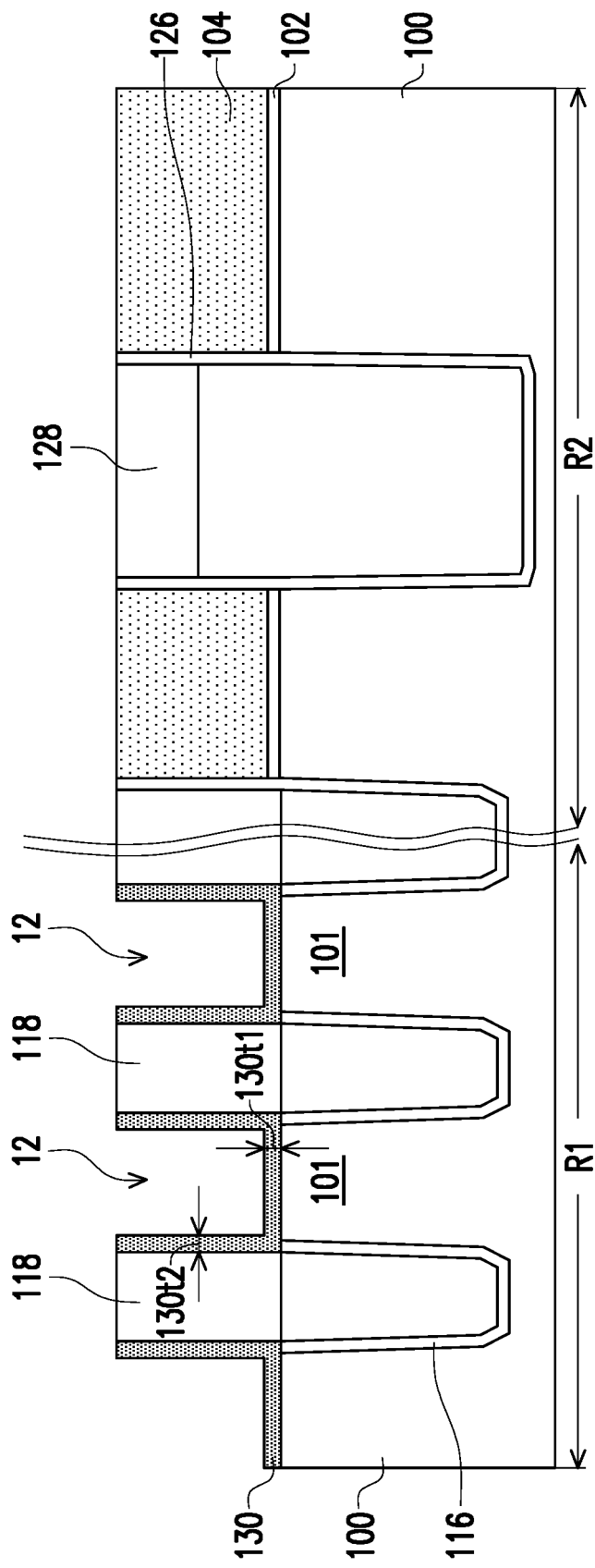
Figure 1G:
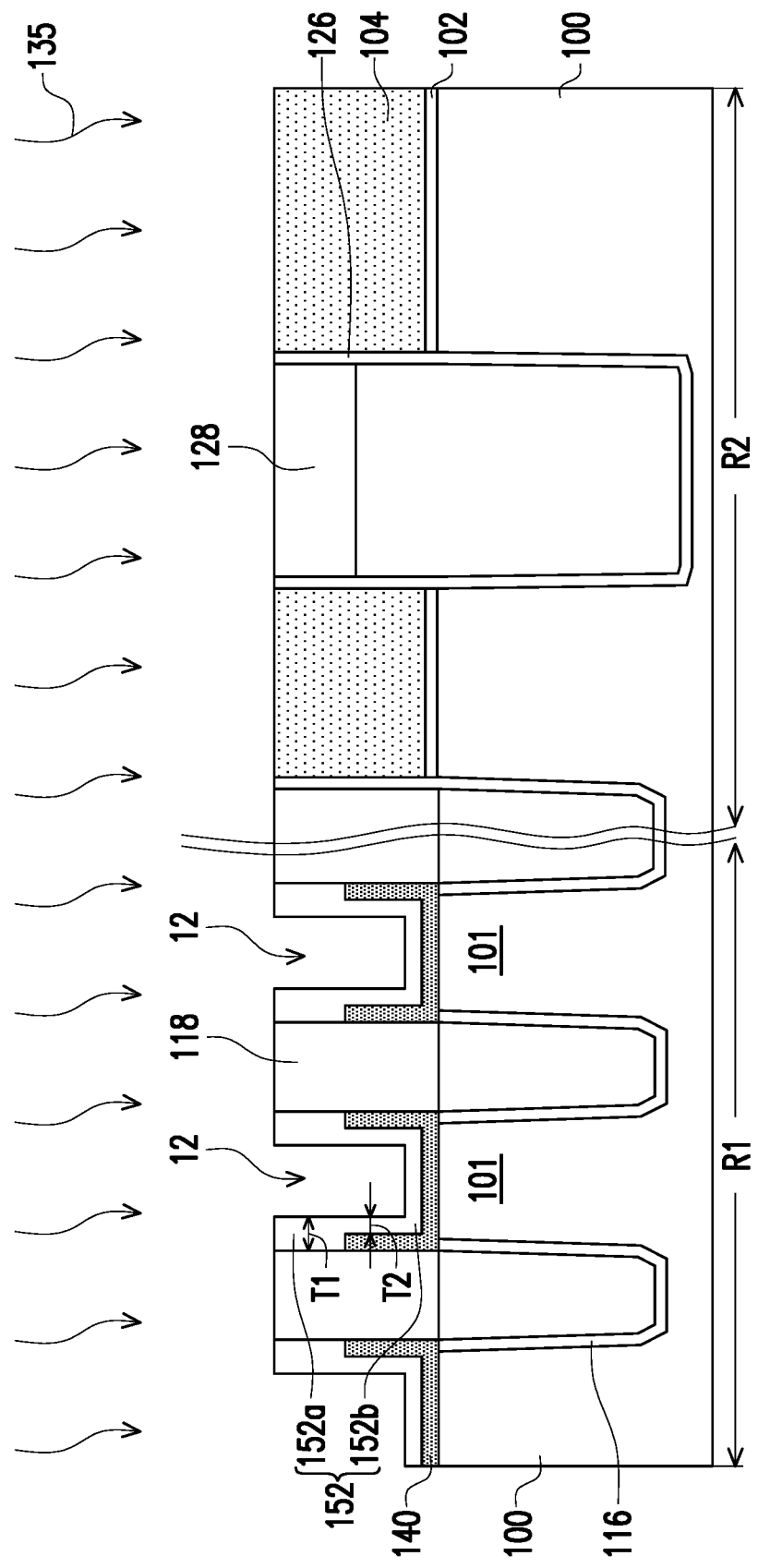
Figure 1H:
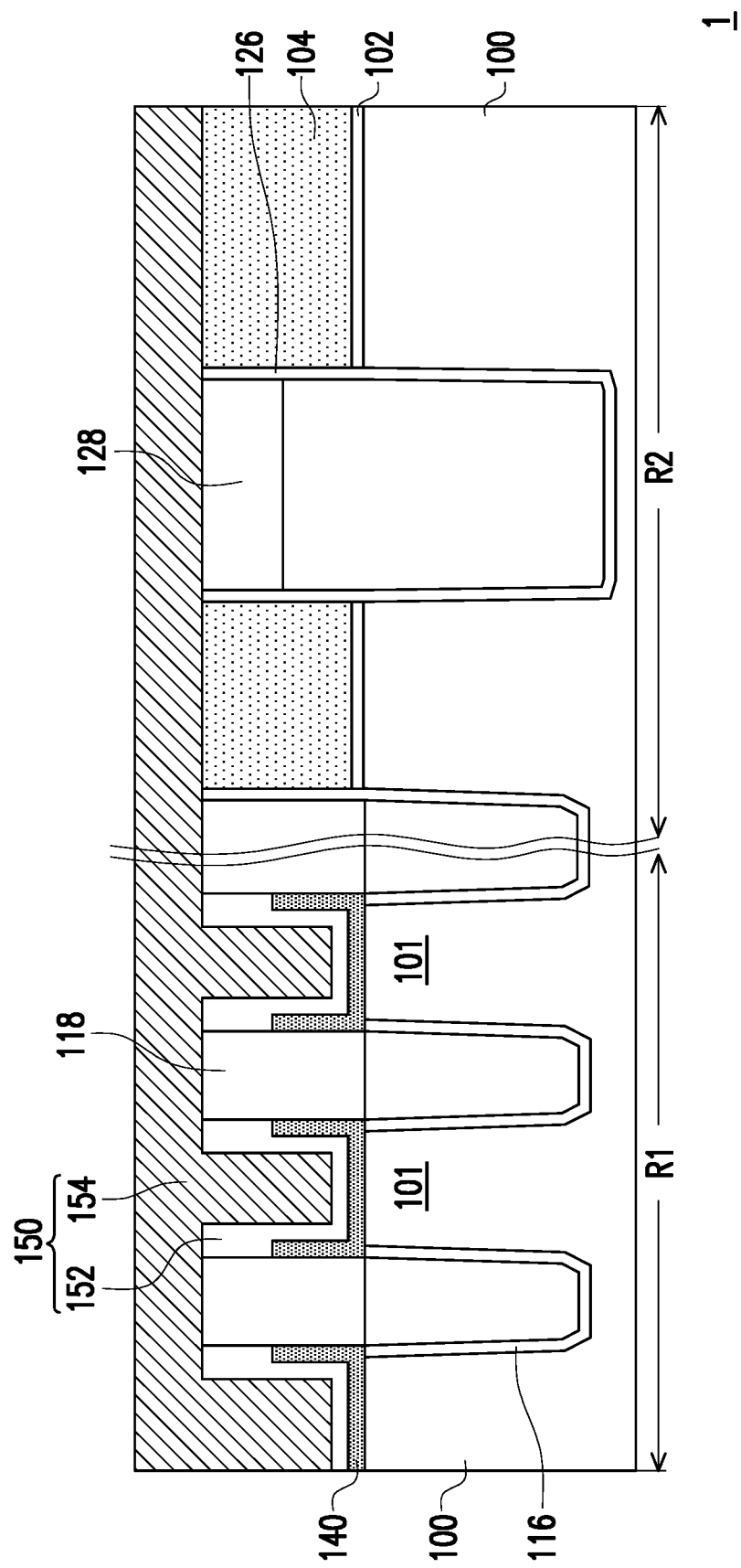

Referring to FIG. 1A, the present embodiment provides a method of manufacturing a semiconductor device 1 (as shown in FIG. 1H) including following steps. First, a substrate 100 is provided. The substrate 100 may include a first region R1 and a second region R2. The first region R1 may be a cell region, and the second region R2 may be a peripheral region. The substrate 100 may be, for example, a semiconductor substrate, a semiconductor compound substrate, or a semiconductor over insulator (SOI) substrate. In the embodiment, the substrate 100 may be a silicon substrate.

Next, a first hard mask pattern 102 and a second hard mask pattern 104 are sequentially formed on the substrate 100. In one embodiment, a material of the first hard mask pattern 102 includes silicon oxide, and a material of the second hard mask pattern 104 includes silicon nitride. In the embodiment, the first hard mask pattern 102 and the second hard mask pattern 104 may be used as an etching mask to remove a portion of the substrate 100 uncovered by the first hard mask pattern 102 and the second hard mask pattern 104, thereby forming a plurality of trenches 10 and 20 in the substrate 100. Specifically, the trenches 10 are formed in the substrate 100 of the first region R1 to form a plurality of fins 101 on the substrate 100. That is, a material of the fin 101 is also a semiconductor material, such as silicon. In addition, the trench 20 is formed in the substrate 100 of the second region R2. In one embodiment, a width of the trench 20 may be greater than or equal to a width of the trench 10.

Then, a conformal layer 106 is formed to overlay surfaces of the trenches 10, 20 and extending to cover a top surface of the second hard mask pattern 104. In one embodiment, a material of the conformal layer 106 may be silicon oxide, which may be formed by chemical vapor deposition (CVD). Thereafter, a filling material 108 is formed on the conformal layer 106 to fill in the trenches 10, 20 and extend to cover the top surface of the second hard mask pattern 104. Specifically, the filling material 108 includes a first material 108a and a second material 108b located on the first material 108a. In one embodiment, the first material 108a may be spin-on glass (SOG), which may be formed by spin coating. In addition, the second material 108b may be silicon oxide, which may be formed by high-density plasma chemical vapor deposition (HDP-CVD) or enhanced high aspect ratio process (eHARP). Since SOG has better fluidity, it can be easily filled into the trenches 10 and 20 without generating voids. In one embodiment, a density of the second material 108b formed by HDP or eHARP is greater than that of the first material 108a formed by SOG. In this case, the second material 108b can effectively protect the underlying substrate 100 from damage in subsequent processes. In one embodiment, the filling material 108 may also include only the first material 108a or the second material 108b.

Referring to FIG. 1B, a planarization process is performed to remove a portion of the filling material 108 and a portion of the conformal layer 106 to expose the top surface of the second hard mask pattern 104. In one embodiment, the planarization process may include a chemical mechanical polishing (CMP) process. After the planarization process, the remaining conformal layer 106 and the filling material 108 are filled in the trench 10 of the first region R1 to form a plurality of liner layers 116 and a plurality of isolation structures 118. The isolation structures 118 are respectively disposed between the fins 101. The liner layers 116 are respectively lining on the bottom surfaces and sidewalls of the isolation structures 118 to separate the isolation structures 118 from the fins 101 or the second hard mask pattern 104. In the embodiment, each isolation structure 118 includes a first dielectric layer 118a and a second dielectric layer 118b on the first dielectric layer 118a. Although the isolation structure 118 shown in FIG. 1B has a double-layered structure, the present invention is not limited thereto. In other embodiments, the isolation structure 118 may include a single-layered structure or a multi-layered structure. In the embodiment, the isolation structure 118 may be referred to as a shallow trench isolation (STI) structure.

Similarly, the remaining conformal layer 106 and filling material 108 may be filled in the trenches 20 of the second region R2 to form a plurality of liner layers 126 and a plurality of isolation structures 128. Each isolation structure 128 includes a first dielectric layer 128a and a second dielectric layer 128b on the first dielectric layer 128a. In one embodiment, an interface between the first dielectric layer 128a and the second dielectric layer 128b may be higher than an interface between the first dielectric layer 118a and the second dielectric layer 118b. In addition, in the embodiment, after the CMP process is performed, the top surfaces of the isolation structures 118, the top surfaces of the isolation structures 128, and the top surface of the second hard mask pattern 104 may be substantially coplanar or level with each other.

Referring to FIG. 1B and FIG. 1C, an etch-back process is performed to remove the second hard mask pattern 104 in the first region R1, thereby forming a plurality of openings 12 on the fins 101. That is, after the etch-back process, the isolation structures 118 may protrude between the fins 101 to form the openings 12 between adjacent isolation structures 118. In this case, as shown in FIG. 1C, the openings 12 may expose the first hard mask pattern 102 and a portion of the liner layer 116 on the fins 101. In one embodiment, an etch-back process may be performed by using a mask layer (not shown) that covers the surfaces of the isolation structures 128 and the second hard mask pattern 104 in the second region R2 as an etch mask, and then remove the mask layer. Therefore, after the second hard mask pattern 104 in the first region R1 is removed, the second hard mask pattern 104 in the second region R2 may still remain, as shown in FIG. 1C. In alternative embodiments, the second hard mask pattern 104 in the first region R1 and the second region R2 may also be removed simultaneously.

Referring to FIG. 1C and FIG. 1D, a cleaning process is performed to remove the first hard mask pattern 102 and the liner layer 116 on the surfaces of the openings 12, thereby exposing the upper surfaces of the isolation structures 118 and the top surfaces of the fins 101. In one embodiment, the first hard mask pattern 102 (or the liner layer 116) and the isolation structure 118 may have materials with different etch selectivities. Therefore, after the said cleaning process is performed, the first hard mask pattern 102 and the liner layer 116 exposed by the opening 12 are removed, and the isolation structure 118 may remain in its original shape. In alternative embodiments, during the said cleaning process, a portion of the isolation structures may also be removed to form bullet-shaped isolation structures 218 (shown in FIG. 2).

Referring to FIG. 1E, a channel material 120 is formed to conformally cover the surfaces of the openings 12 and extend to cover the top surfaces of the isolation structures 118 in the first region R1. In addition, the channel material 120 also covers the top surfaces of the isolation structures 128 and the top surface of the second hard mask pattern 104 in the second region R2. In one embodiment, the channel material 120 includes doped polysilicon, undoped polysilicon, or a combination thereof. The channel material 120 may be formed by chemical vapor deposition and have a thickness greater than 10 nm, e.g., 27 nm.

Referring to FIG. 1E and FIG. 1F, an etching process is performed to remove the channel material 120 on the top surfaces of the isolation structures 118 in the first region R1 and the channel material 120 on the second region R2, thereby forming a plurality of channel material layers 130 in the openings 12 respectively. In this case, as shown in FIG. 1F, the channel material layer 130 conformally covers the surface of the opening 12 to form a U-shaped structure. In one embodiment, the said etching process may be a blanket dry etching process, namely, the said etching process may be performed without requiring any etching mask. After the said etching process, a bottom thickness 130t1 of the channel material layer 130 is thinned to, for example, but not limited to, 5 nm. In the embodiment, the bottom thickness 130t1 of the channel material layer 130 may be greater than a sidewall thickness 130t2 thereof. In this case, the thicker bottom thickness 130t1 will not result in the crack or discontinuous issue due to thinner thickness after the subsequent oxidation process is performed.

Referring to FIG. 1F and FIG. 1G, an oxidation process 135 is performed to oxidize a portion of the channel material layer 130 into a gate dielectric layer 152, and to transform a remaining portion of the channel material layer 130 into a plurality of channel layers 140. In one embodiment, the oxidation process 135 includes a dry oxidation process or a wet oxidation process. In the embodiment, a material of the gate dielectric layer 152 may be silicon oxide, and its material may be derived from the channel material layer 130. In addition, in the oxidation process 135, the channel material layer 130 may be gradually oxidized from top to bottom to form the gate dielectric layer 152. In this case, as shown in FIG. 1G, the channel material layer 130 located at an upper portion of the opening 12 is completely oxidized into a first portion 152a, and the channel material layer 130 located at a lower portion of the opening 12 is partially oxidized into a second portion 152b. That is, the first portion 152a overlays the upper sidewall of the isolation structure 118, while the second portion 152b overlays the channel layer 140. In the embodiment, a thickness T1 of the first portion 152a may be greater than a thickness T2 of the second portion 152b. In addition, the thickness T1 of the first portion 152a and the thickness T2 of the second portion 152b may be adjusted according to the design requirements of the device voltage, and the present invention is not limited thereto.

It should be noted that, after the oxidation process 135 is performed, the channel layer 140 is in direct contact with a corresponding fin 101 and extends to cover a lower sidewall of a corresponding isolation structure 118, thereby forming a U-shaped structure. In one embodiment, a height of the channel layer 140 may decrease as the process time of the oxidation process 135 increases. That is, as the process time of the oxidation process 135 increases, more portion of the channel material layer 130 is oxidized into the gate dielectric layer 152, so that the thickness and/or height of the channel layer 140 is reduced. In alternative embodiments, the thickness of the channel layer 240 may be tapered in a direction perpendicular to the top surface of the substrate 100 to form a bull horn shape, as shown in FIG. 2.

Referring to FIG. 1H, a gate electrode 154 is formed on the gate dielectric layer 152 to form a gate structure 150. Specifically, the gate electrode 154 may be filled in the openings 12 and extend to cover the top surfaces of the isolation structures 118 in the first region R1, the top surfaces of the isolation structures 128 in the second region R2, and the top surface of the second hard mask pattern 104 in the second region R2. That is, the gate electrode 154 may extend between two adjacent isolation structures to form a continuous structure. In one embodiment, a material of the gate electrode 154 may include a conductive material, such as doped polysilicon, undoped polysilicon, or a combination thereof, and the formation method may be chemical vapor deposition.

After the gate structure 150 is formed, the semiconductor device 1 of the embodiment is accomplished. Specifically, the semiconductor device 1 may include: the substrate 100, the plurality of isolation structures 118, the plurality of channel layers 140, and the gate structure 150. The substrate 100 includes the plurality of fins 101 thereon. The plurality of isolation structures 118 are respectively disposed between the plurality of fins 101. The top surface of the plurality of isolation structures 118 is higher than the top surface of the plurality of fins 101 to form the plurality of openings 12. The plurality of channel layers 140 are respectively disposed in the plurality of openings 12. Each channel layer 140 is in contact with the corresponding fin 101 and extends to cover the lower sidewall of the corresponding isolation structure 118 to form a U-shaped structure. The gate structure 150 is filled in the plurality of openings 12 and extends to cover the top surface of the plurality of isolation structures 118. From another perspective, the gate structure 150 may have a plurality of comb portions embedded between adjacent isolation structures 118. It should be noted that, in the embodiment, a contact area between the gate structure 150 and a corresponding channel layer 140 may be greater than a top area of a corresponding fin 101. That is, in the embodiment, the device width between the fin 101 and the gate structure 150 may be increased through the channel layer 140 in contact with the fin 101, so as to reduce the unit size, thereby increasing the usable area of the chip.

Figure 2:
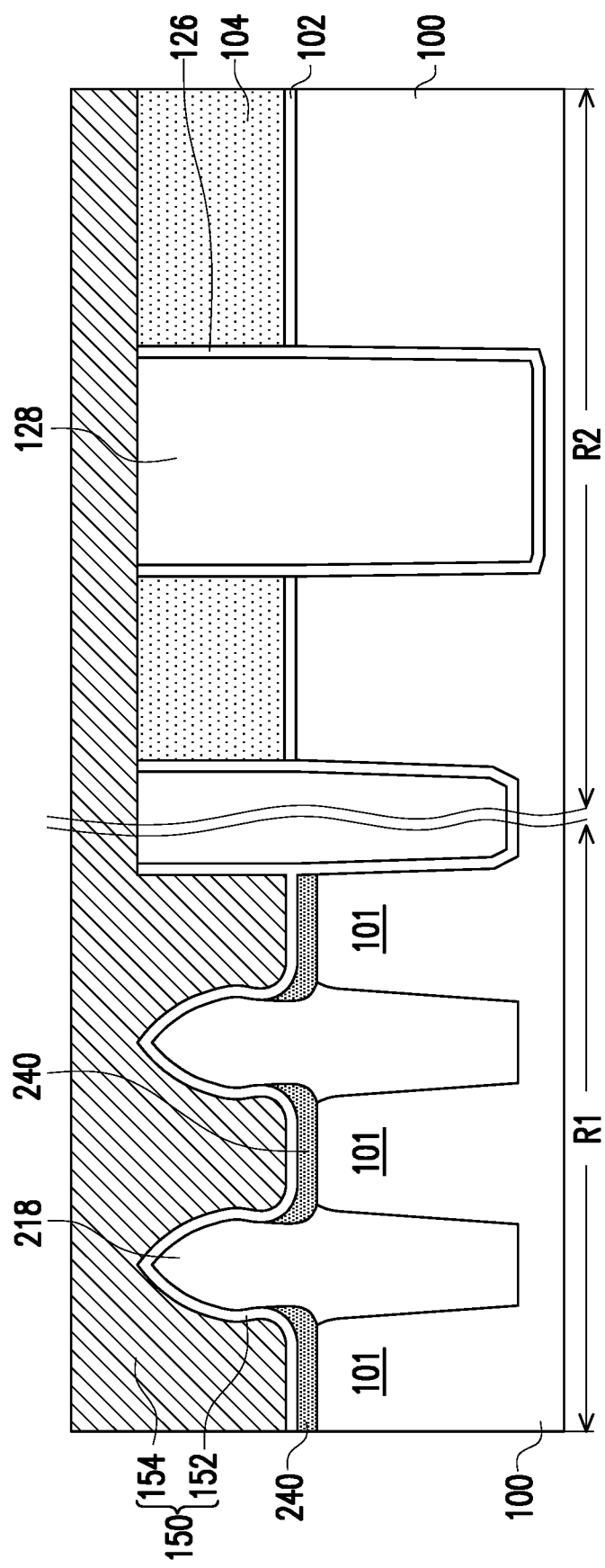
FIG. 2 is a schematic cross-sectional view of a semiconductor device according to a second embodiment of the invention.

FIG. 2 is a schematic cross-sectional view of a semiconductor device according to a second embodiment of the invention.

Referring to FIG. 2, basically, a semiconductor device 2 of the second embodiment is similar to the semiconductor device 1 of the first embodiment, and the same components and materials have been described in detail in the above paragraphs, and will not be repeated here. The difference between the above two lies in that the semiconductor device 2 has a bull horn shaped channel layer 240 and a bullet-shaped isolation structure 218. That is, a thickness of the channel layer 240 may be tapered in a direction perpendicular to the top surface of the substrate 100, and a width of the isolation structure 218 may be tapered in a direction perpendicular to the top surface of the substrate 100. In the embodiment, the bullet-shaped isolation structure 218 may facilitate the gate electrode 154 filling into the opening 12 with a wider upper portion and a narrower lower portion (as shown in FIG. 1G to FIG. 1H), so as to avoid forming voids in the opening 12.

In one embodiment, the semiconductor devices 1 and 2 may be used in a resistive random access memory (RRAM). That is, the semiconductor elements 1 and 2 may be formed in the front-end-of-line (FEOL) process, the memory cells of the RRAM may be formed in the back-end-of-line (BEOL) process, and the semiconductor devices 1 and 2 may be electrically connected to the memory cells by using the interconnection structure, so as to form a memory structure with a transistor and a resistor (1T1R). Since the RRAM requires a large current to operate, the device area of the conventional RRAM cannot be scaled due to the excessively large occupied area of the transistors. In the embodiment, the semiconductor devices 1 and 2 can utilize the channel layer with the U-shaped structure to increase the device width and reduce the unit size, so as to increase the usable area of the chip, thereby reducing the device area of the RRAM. Therefore, the RRAM of the embodiment can conform to the current trend of miniaturized devices, so as to increase the commercial competitiveness. In alternative embodiments, the semiconductor devices 1 and 2 may also be applied to other application fields that require transistors, such as dynamic random access memory (DRAM), static random access memory (SRAM), or the like.

In summary, in the embodiment of the present invention, a plurality of isolation structures are protruded between a plurality of fins, so that a top surface of the plurality of isolation structures is higher than a top surface of the plurality of fins, so as to form a plurality of openings. Next, a plurality of channel layers are respectively formed in the plurality of openings, so that each channel layer is in contact with a corresponding fin and extends to cover a lower sidewall of a corresponding isolation structure, thereby forming a U-shaped structure. The U-shaped structure of the channel layer can effectively increase the device width and reduce the unit size, so as to increase the usable area of the chip, thereby achieving the purpose of miniaturizing devices.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:
1. A semiconductor device, comprising:
a substrate, comprising a plurality of fins thereon;
a plurality of isolation structures, respectively disposed between the plurality of fins, wherein a top surface of the plurality of isolation structures is higher than a top surface of the plurality of fins to form a plurality of openings;

a plurality of channel layers, respectively disposed in the plurality of openings, wherein each channel layer is in contact with a corresponding fin and extends to cover a lower sidewall of a corresponding isolation structure, thereby forming a U-shaped structure; and a gate structure, filled in the plurality of openings and extending to cover the top surface of the plurality of isolation structures.

2. The semiconductor device according to claim 1, wherein a thickness of the plurality of channel layers are tapered in a direction perpendicular to a top surface of the substrate to form a bull horn shape.

3. The semiconductor device according to claim 2, wherein a width of the plurality of isolation structures are tapered along the direction perpendicular to the top surface of the substrate to form a bullet shape.

4. The semiconductor device according to claim 1, wherein the gate structure comprises:

a gate dielectric layer comprising:

a first portion overlying an upper sidewall of the plurality of isolation structures; and a second portion overlying the plurality of channel layers, wherein the first portion has a thickness greater than a thickness of the second portion; and a gate electrode disposed on the gate dielectric layer.

5. The semiconductor device according to claim 4, wherein the gate electrode extends continuously between two adjacent isolation structures.

6. The semiconductor device according to claim 1, wherein a contact area between the gate structure and a corresponding channel layer is greater than a top area of a corresponding fin.

7. The semiconductor device according to claim 1, wherein a material of the plurality of channel layers comprises doped polysilicon, undoped polysilicon, or a combination thereof.

8. The semiconductor device according to claim 1, further comprising: a memory cell disposed in a back-end-of-line (BEOL) structure over the gate structure, thereby constituting a memory structure of a transistor and a resistor (1T1R).

* * * * *